(12) United States Patent
Choi et al.

(10) Patent No.: US 9,048,849 B2
(45) Date of Patent: Jun. 2, 2015

(54) SUPPLY REGULATED VOLTAGE CONTROLLED OSCILLATOR INCLUDING ACTIVE LOOP FILTER AND PHASE LOCKED LOOP USING THE SAME

(71) Applicant: Industry-Academic Cooperation Foundation, Yonsei University, Seoul (KR)

(72) Inventors: Woo-Young Choi, Seoul (KR); Kwang-Chun Choi, Seoul (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 11 days.

(21) Appl. No.: 13/926,233

(22) Filed: Jun. 25, 2013

(65) Prior Publication Data

US 2014/0085011 A1    Mar. 27, 2014

(30) Foreign Application Priority Data

Sep. 26, 2012 (KR) .......................... 10-2012-0107254

(51) Int. Cl.
*H03L 7/00* (2006.01)
*H03L 7/099* (2006.01)
*H03L 7/093* (2006.01)
*H03L 7/18* (2006.01)

(52) U.S. Cl.
CPC . *H03L 7/099* (2013.01); *H03L 7/18* (2013.01); *H03L 7/093* (2013.01); *H03L 7/0995* (2013.01)

(58) Field of Classification Search
CPC ............ H03L 7/099; H03L 7/093; H03L 7/18
USPC ........... 331/16, 34, 57, 183, 17; 327/156, 159
See application file for complete search history.

(56) References Cited

U.S. PATENT DOCUMENTS

2006/0114069 A1*   6/2006   Kojima et al. .................. 331/16
2008/0157888 A1*   7/2008   Goldman ...................... 331/1 R

FOREIGN PATENT DOCUMENTS

| JP | 2008-042339 A | 2/2008 |
| KR | 10-2010-0001696 A | 1/2010 |
| KR | 10-2011-0055023 A | 5/2011 |
| KR | 10-2012-0023717 A | 3/2012 |

* cited by examiner

*Primary Examiner* — Arnold Kinkead
(74) *Attorney, Agent, or Firm* — Carter, DeLuca, Farrell & Schmidt, LLP

(57) ABSTRACT

The inventive concept relates to a supply regulated voltage controlled oscillator having a function of an active loop filter by sharing one operational amplifier without additional use of active elements in a supply regulated voltage controlled oscillator using an operational amplifier as a supply regulator, and a phase locked loop using the same.

9 Claims, 10 Drawing Sheets

SUPPLY REGULATED VOLTAGE CONTROLLED OSCILLATOR INCLUDING ACTIVE LOOP FILTER AND PHASE LOCKED LOOP USING THE SAME

CROSS-REFERENCE TO RELATED APPLICATIONS

This U.S. non-provisional patent application claims priority under 35 U.S.C. §119 of Korean Patent Application No. 10-2012-0107254, filed on Sep. 26, 2012, the entire contents of which are hereby incorporated by reference.

BACKGROUND

The present inventive concept herein relates to supply regulated voltage controlled oscillators and phase locked loops using the same, and more particularly, to a supply regulated voltage controlled oscillator including an active loop filter and a phase locked loop using the same.

A voltage controlled oscillator generates an oscillating signal corresponding to a voltage output from a loop filter of a phase locked loop and provides the generated oscillating signal to the outside. The phase locked loop (PLL) receives a reference frequency signal from the outside and receives a frequency signal which is generated from a voltage controlled oscillator autonomously having a variable frequency through a negative feedback loop to control the voltage controlled oscillator so that a signal is output which has a minimum phase difference between the two received frequency signals while having a same frequency. The phase locked loop is widely used in a communication system or digital equipment that performs generation or restoration of a clock signal, a frequency modulation, a frequency demodulation, a frequency synthesis and a frequency multiplication.

SUMMARY

Embodiments of the inventive concept provide a supply regulated voltage controlled oscillator including an operational amplifier used as a supply regulator and a supply controlled oscillator. The supply regulated voltage controlled oscillator including an operational amplifier used as a supply regulator and a supply controlled oscillator may include a negative feedback circuit feeding an output signal of the operational amplifier back to an inverting input terminal of the operational amplifier. The negative feedback circuit has an active loop filter function including a loop filter constituted by passive elements and thereby the supply regulated voltage controlled oscillator has an active loop filter function.

Embodiments of the inventive concept also provide a phase locked loop including a phase frequency detector, a frequency divider, a charge pump, a loop filter and a supply controlled oscillator. In the phase locked loop including a phase frequency detector, a frequency divider, a charge pump, a loop filter and a supply controlled oscillator, the phase locked loop further comprises one operational amplifier, and the loop filter and the supply controlled oscillator share the operational amplifier to have a function of an active loop filter and a function of a supply regulated voltage controlled oscillator.

Embodiments of the inventive concept also provide a supply regulated voltage controlled oscillator. The supply regulated voltage controlled oscillator may include a supply controlled oscillator outputting a signal corresponding to a signal of an input stage; an operational amplifier that a signal corresponding to a feedback signal of the supply controlled oscillator is input to an inverting input terminal, a reference voltage is input to a noninverting input terminal and an output stage is connected to the input stage of the supply controlled oscillator; and a negative feedback circuit feeding the output signal of the operational amplifier back to the inverting input terminal of the operational amplifier. The negative feedback circuit has an active loop filter function by interacting a loop filter constituted by passive elements with the operational amplifier and thereby supply regulated voltage controlled oscillator has an active loop filter function.

Embodiments of the inventive concept also provide a phase locked loop. The phase locked loop may include a supply regulated voltage controlled oscillator outputting a clock signal corresponding to an input signal; a frequency divider receiving a feedback signal of the supply regulated voltage controlled oscillator; a phase frequency detector receiving and comparing a reference clock and an output of the frequency divider to output a pulse corresponding to a difference between the two frequencies; a charge pump controlling charge amount on the basis of a pulse corresponding the difference between the two frequencies; an operation amplifier that an output of the charge pump is input to an inverting input terminal, a reference voltage is input to a noninverting input terminal and an output stage is connected to an input stage of the supply regulated voltage controlled oscillator; and a negative feedback circuit feeding an output signal of the operational amplifier back to the inverting input terminal of the operational amplifier. The negative feedback circuit has an active loop filter function by interacting a loop filter constituted by passive elements with the operational amplifier.

BRIEF DESCRIPTION OF THE FIGURES

Preferred embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

DETAILED DESCRIPTION OF THE EMBODIMENTS

Figure 1:
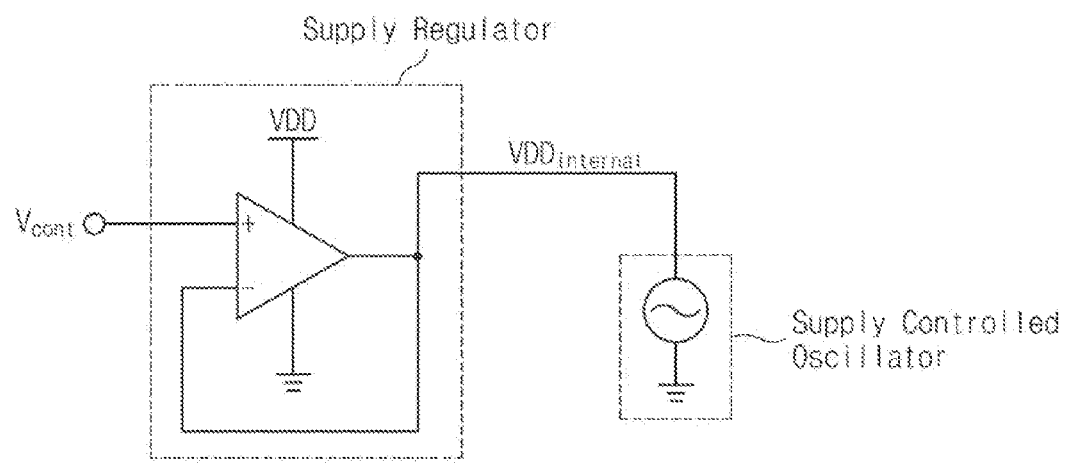
FIG. 1 is a drawing illustrating a supply regulated voltage controlled oscillator.

Embodiments of inventive concepts will be described more fully hereinafter with reference to the accompanying drawings, in which embodiments of the invention are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

As a CMOS process is developed, the degree that a power supply voltage is lowered is greater than the degree that a threshold voltage is lowered of a MOSFET, instead of a voltage controlled oscillator based on a differential delay cell that has been widely used, a voltage controlled oscillator (VCO) based on a single-ended type delay cell such as an inverter or pseudo differential delay cell is preferred. This is because as a process is developed, a single-ended type voltage controlled oscillator can generate a clock that power efficiency (Hz/W) is very superior, phase noise performance is good and a frequency range is very wide while having a high frequency of GHz class as compared with a differential type voltage controlled oscillator. However, since a single-ended type voltage controlled oscillator is very vulnerable to an external supply noise, to stably generate a clock having a small jitter, a regulated power supply has to be supplied to a phase locked loop using a supply regulator. In this case, because of a drop-out voltage of the supply regulator, a supply voltage higher than a supply voltage needed in a phase locked loop has to be applied from the outside and thereby power consumption becomes great. To solve the problem, various methods have been studied. Since other blocks except a voltage controlled oscillator among blocks constituting a phase locked loop are not greatly vulnerable to a power supply noise, a method has been studied which embodies a lower power phase locked loop using a supply regulator only in a voltage controlled oscillator instead of using a supply regulator in the whole phase locked loop.

FIG. 1 is a drawing illustrating a supply regulated voltage controlled oscillator having a supply regulator. A clock signal is generated using a supply controlled oscillator (SCO) of which a frequency is changed according to a supply voltage of the oscillator. A supply voltage $VDD_{internal}$ of the supply controlled oscillator is supplied from the supply regulator and the supply voltage becomes equal to a control voltage $V_{cont}$ of the voltage controlled oscillator by a negative feedback of the supply regulator. Depending on the control voltage $V_{cont}$, the supply voltage of the supply controlled oscillator is changed and an oscillation frequency of the supply controlled oscillator is changed.

The structure described above has various advantages. The supply regulator can offset effect of an external supply noise on an oscillator. It may depend on the structure, but since a single-ended type supply controlled oscillator easily oscillates at very low supply voltage of 0.2V or less, even if considering a drop-out voltage of the supply regulator, if a phase locked loop is used in an application field requiring a low frequency of 100 MHz or less, a minimum external supply voltage VDD that is needed to generate a clock may be very lowered.

A frequency gain $K_{VCO}$ (Hz/V) of the voltage controlled oscillator (VCO) is a coefficient greatly affecting loop-dynamics of the phase locked loop and in case of the supply regulated voltage controlled oscillator (SRVCO), the frequency gain $K_{VCO}$ has a characteristic that is linearly proportional to an output oscillation frequency. Thus, even if a division coefficient of the phase locked loop is changed and thereby an output frequency of the phase locked loop is changed, since a frequency gain $K_{VCO}$ (Hz/V) of the voltage controlled oscillator (VCO) is also changed in proportion to a change of the output frequency, loop dynamics of the phase locked loop is not greatly changed. The characteristic of the supply regulated voltage controlled oscillator (SRVCO) has an advantage that the characteristic is suited for a frequency synthesizer controlling a division coefficient of the phase locked loop to change an output frequency. Because of those advantages, when designing a phase locked loop of high performance or a frequency synthesizer based on a phase locked loop in low power mode in an environment like a microprocessor, a supply regulated voltage controlled oscillator (SRVCO) is widely used.

However, the supply regulated voltage controlled oscillator (SRVCO) has disadvantages as compared with voltage controlled oscillators (VCO) having different structures. An operational amplifier (OP amp) used in the supply regulated voltage controlled oscillator (SRVCO) as a supply regulator for preventing an inflow of an external supply noise has to be an operational amplifier of high performance having a great voltage gain and a wide bandwidth. This is because as a voltage gain of the operational amplifier is greater, an inflow of an external supply noise is more easily prevented and not to have a bad influence on a loop of a phase locked loop, a bandwidth of the operational amplifier has to be at least five to ten times as great as a bandwidth of a loop of a phase locked loop. Due to the operational amplifier of high performance, additional power and additional chip area are consumed. Also, an operational amplifier constituted by active elements autonomously generates a noise and the noise may have a bad influence on output phase noise performance of the voltage controlled oscillator (VCO). That is, an inflow of an external supply noise is prevented using a supply regulator but a small noise is internally generated.

Figure 2:
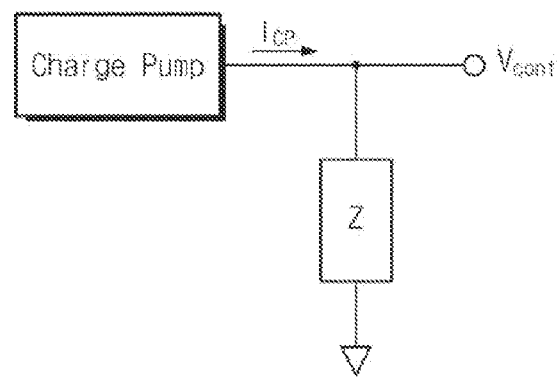
FIG. 2 is a drawing illustrating a passive loop filter embodied using only passive elements.
Figure 3:
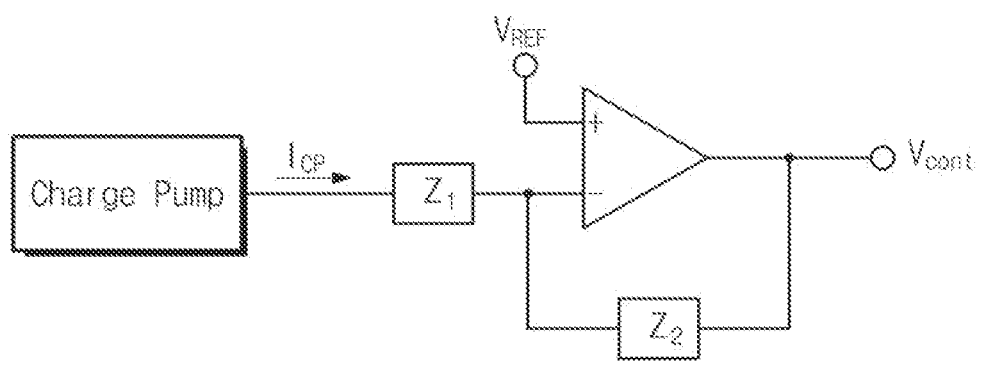
FIG. 3 is a drawing illustrating an active loop filter embodied using an operational amplifier which is an active circuit together with passive elements.

FIGS. 2 and 3 are drawings illustrating a loop filter used to regulate a charge pump and a negative feedback loop in a phase locked loop. The loop filter performs a function of filtering an unnecessary signal in the process of determining an input voltage of a voltage controlled oscillator by comparing output frequency information and a reference frequency through a loop. When designing a phase locked loop, a structure of an oscillator is important but a loop filter being used to regulate a negative feedback loop of the phase locked loop is also very important.

FIG. 2 is a drawing illustrating a passive loop filter embodied using only passive elements.

In a Z area of the drawing, a capacitor and a resistor are connected to each other to constitute a secondary filter or a tertiary filter and pass band lock time is determined according to a constituting method. Since embodying a loop filter using only passive elements without using active elements autonomously generating a noise like a transistor, the loop filter has superior noise characteristic and has been widely used. In this case, a control voltage $V_{cont}$ of an oscillator becomes an output voltage of a charge pump. That is, the output voltage of the charge pump and the control voltage of the oscillator have no choice but to have a same value. In order for the charge pump to properly operate, the output voltage of the charge pump has to be higher than a basis voltage (0V) of the charge pump by 0.2V or more and lower than a supply voltage of the charge pump by 0.2V or more. If we assume that a supply voltage of a phase locked loop is 1V, only when the output voltage of the charge pump has values of 0.2V through 0.8V, the charge pump can properly operate. Thus, even if a voltage controlled oscillator is designed to operate in a control voltage $V_{cont}$ of a wide range, an operation range of the voltage controlled oscillator may be limited due to an allowable output voltage range of the charge pump. The lower a supply voltage of the phase locked loop is, the worse the problem becomes.

FIG. 3 is a drawing illustrating an active loop filter embodied using an operational amplifier which is an active circuit together with passive elements in a $Z_1$ area and a $Z_2$. Embodying the active loop filter using an active circuit has two advantages.

A first advantage is that an output voltage of a charge pump and a control voltage of an oscillator can be separated from each other. The output voltage of the charge pump becomes always the same as a reference voltage $V_{REF}$ regardless of the control voltage $V_{cont}$ of the oscillator by a negative feedback of the operational amplifier constituting the active loop filter. If a value of the reference voltage $V_{REF}$ is within the range of an output voltage where the charge pump can properly operate, the charge pump can properly operate regardless of the control voltage $V_{cont}$ of the oscillator and the problem that the charge pump limits an operation range of the voltage controlled oscillator (VCO) can be solved.

A second advantage is that various complicated transfer functions can be embodied without using an inductor. Since a wide area is needed to embody an inductor on a chip, it is not well used to embody a transfer function by an inductor and a passive loop filter. Since if using an active loop filter, a transfer function can be embodied by only a resistor and a capacitor, the active loop filter is well used in an application field that reducing a reference spur is important.

However, since an active loop filter has a great disadvantage that additionally needs an operational amplifier which is an active circuit, it is not well used. The operational amplifier has to be designed to have a great voltage gain and a wide bandwidth like the operational amplifier being used in the supply regulated voltage controlled oscillator (SRVCO) described above. If using a high performance operational amplifier satisfying that condition, since power and area are additionally consumed and a noise is autonomously generated, the whole phase noise performance of the phase locked loop is deteriorated. Because of the disadvantage, an active loop filter is not used except a special case.

Figure 4:
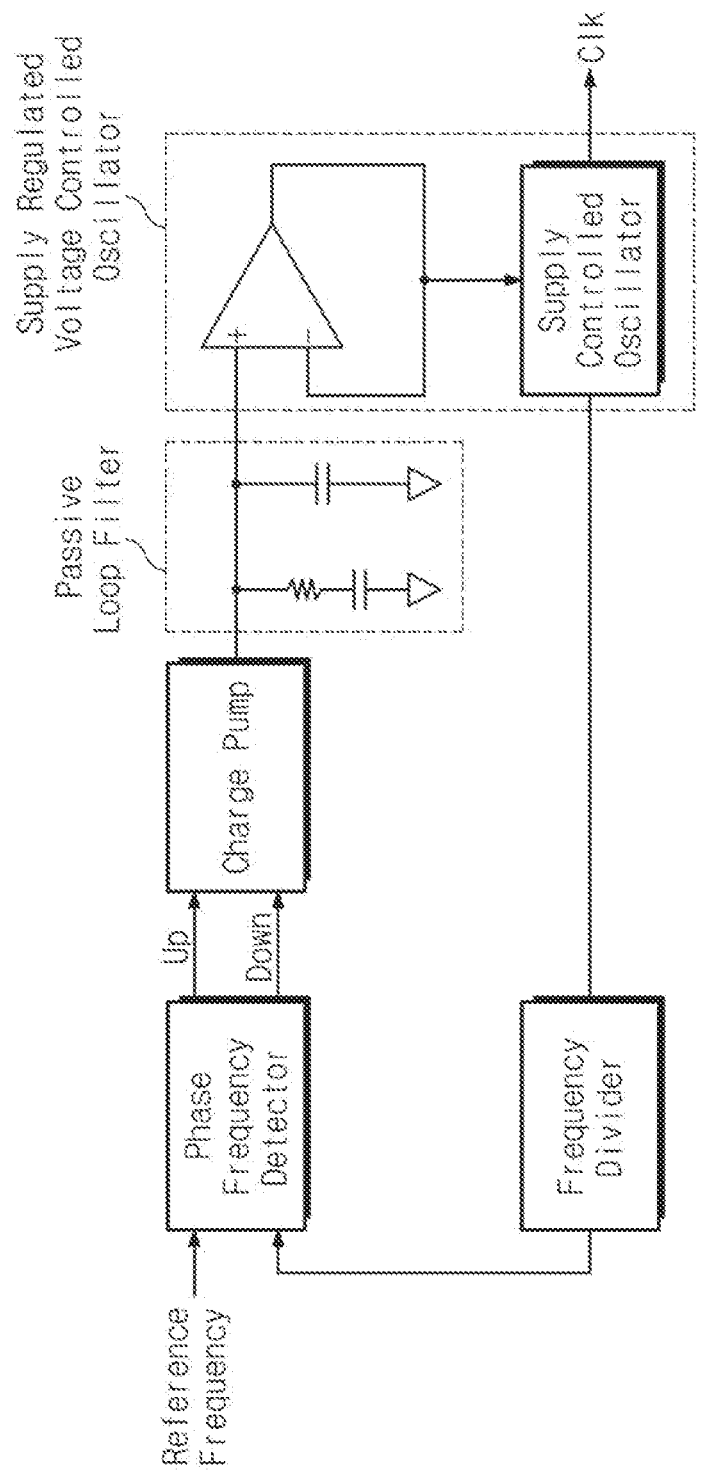
FIG. 4 is a drawing illustrating a general phase locked loop using a passive loop filter and a supply regulated voltage controlled oscillator.

FIG. 4 is a drawing illustrating a general phase locked loop using a passive loop filter and a supply regulated voltage controlled oscillator. The phase locked loop corresponds to a tertiary phase locked loop embodied using a secondary passive loop filter. The phase locked loop is a structure that has been most widely used but has problems of the passive loop filter described above. That is, an input voltage of a voltage controlled oscillator (VCO) becomes the same as an output voltage of a charge pump and thereby an operation range of the voltage controlled oscillator (VCO) is limited.

Figure 5:
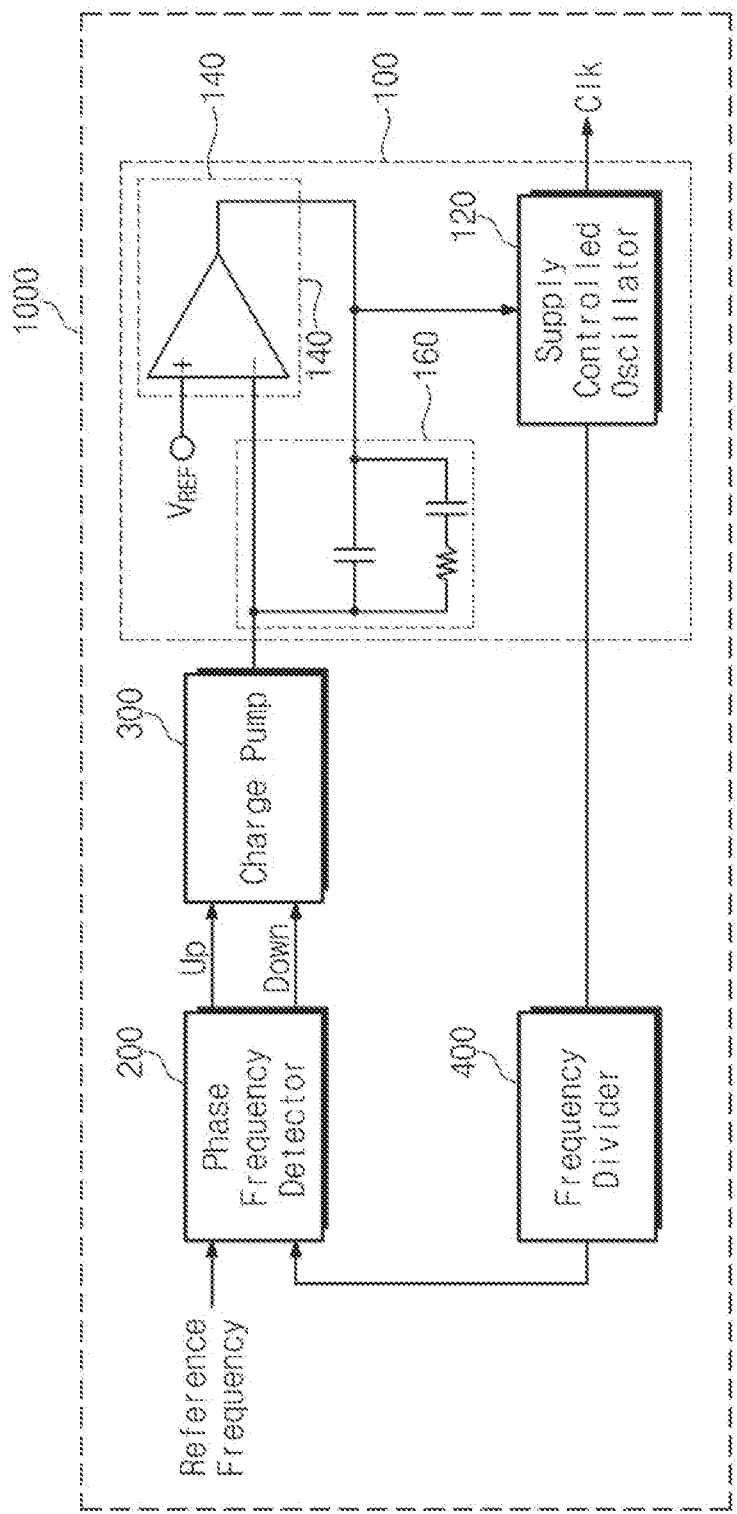
FIG. 5 is a drawing illustrating a phase locked loop using a supply regulated voltage controlled oscillator having an active loop filter function in accordance with some embodiments of the inventive concept.

FIG. 5 is a drawing illustrating a phase locked loop 1000 using a supply regulated voltage controlled oscillator 100 having an active loop filter function in accordance with some embodiments of the inventive concept. The phase locked loop 1000 may include a supply regulated voltage controlled oscillator 100 having an active loop filter function, a phase frequency detector 200 comparing a reference frequency with a frequency output from a frequency divider to output a difference between the two frequencies, a charge pump 300 controlling charge amount according to an output of the phase frequency detector 200 and a frequency divider 400 dividing an output frequency of the supply regulated voltage controlled oscillator 100 having an active loop filter function.

Since the supply regulated voltage controlled oscillator (SRVCO) is embodied with a supply controlled oscillator 120 using a high performance operational amplifier 140 as a supply regulator and a negative feedback is formed using the operational amplifier 140, the supply regulated voltage controlled oscillator 100 having an active loop filter function can be embodied by sharing the operational amplifier 140 and adding only passive elements such as a resistor and a capacitor to the negative feedback. If using that structure, using only one operational amplifier 140, a supply regulator function and an active loop filter function can be embodied at the same time in the phase locked loop 1000 including the supply controlled oscillator 120 and a passive loop filter 160. When comparing with the traditional supply regulated voltage controlled oscillator and the phase locked loop, since an operational amplifier is not additionally used, the advantages of an active loop filter described above can be obtained while power, a chip area and noise performance do not suffer a loss.

The supply regulated voltage controlled oscillator 100 having an active loop filter function in accordance with some embodiments of the inventive concept has another advantage as compared with a conventional supply regulated voltage controlled oscillator (SRVCO). In the phase locked loop, due to a characteristic change of a circuit caused by changes of process, voltage and temperature, there is no saying where a control voltage of the oscillator converges. Thus, the operational amplifier 140 included in the supply regulated voltage controlled oscillator has to be designed in the form of a rail to rail amplifier that operates while maintaining performance even if a common-mode voltage of two input voltages of the operational amplifier 140 has any value. Since two input voltages of the supply regulated voltage controlled oscillator (SRVCO) having an active loop filter function in accordance with some embodiments of the inventive concept are always the same as the reference voltage $V_{REF}$, it is not necessary to have a rail-to-rail amplifier characteristic.

The supply regulated voltage controlled oscillator 100 having an active loop filter function in accordance with some embodiments of the inventive concept and the phase locked loop 1000 using the supply regulated voltage controlled oscillator 100 may be usefully used for two purposes below.

It is very useful when designing a low power phase locked loop using a very low supply voltage of 0.5V or less. Among blocks constituting a phase locked loop, a phase frequency detector (PFD) and a frequency divider (FD) are embodied using a digital logic circuit. If an operation speed of the circuit constituted by a digital logic is low due to the nature of the circuit, that is, a frequency of a reference clock and an output frequency of the phase locked loop are sufficiently low, even if a supply voltage is very low, the circuit constituted by a digital logic can normally operates. In case of a supply regulated voltage controller, it can normally operate at a supply voltage of 0.5V or less and since a single-ended type supply controlled oscillator normally oscillates at a very low voltage, it is not difficult to design a supply regulated voltage controlled oscillator that oscillates at frequencies of the range of several tens of kilohertz through 200 MHz at a supply voltage of 0.5V even considering a drop-out voltage of a supply regulator. However, in case of a charge pump, if a supply voltage is lowered below 0.5V, since an output voltage allowable range of the charge pump is narrowed to 0.1V or less, performance of the phase locked loop is limited. Thus, the charge pump is the greatest obstacle when lowering a supply voltage of the phase locked loop. If using an active loop filter, since an output voltage of the charge pump is fixed to a specific voltage, the problem can be solved that performance of the phase locked loop is limited. Thus, if using the supply regulated voltage controlled oscillator having an active loop filter function in accordance with some embodiments of the inventive concept, since an active loop filter function can be embodied without additionally using an operational amplifier while power, a chip area and noise performance do not suffer a loss, the problem of an output voltage range of the charge pump can be easily solved.

Figure 6:
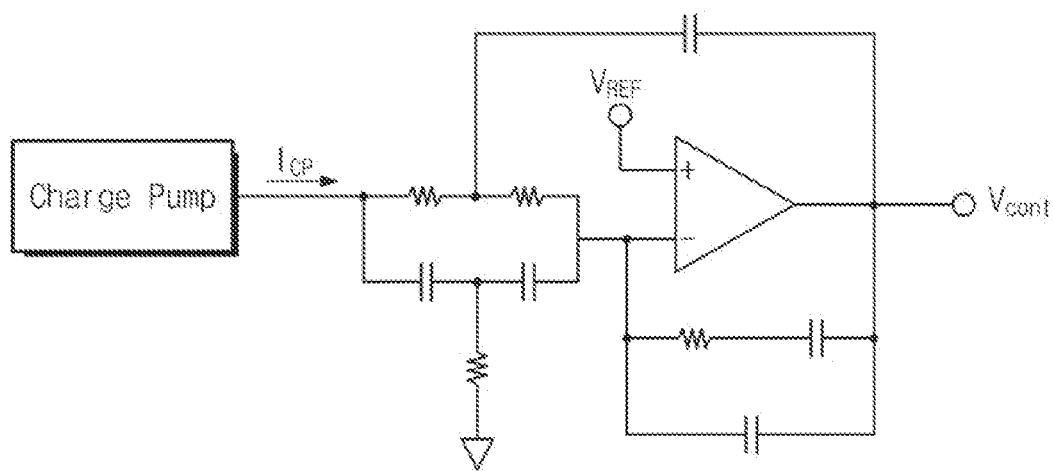
FIG. 6 is a drawing illustrating a band limiting filter embodied using an active loop filter.

A reference spur of a phase locked loop is very important in an application field such as a fractional-N frequency synthesizer. If using constituting a circuit like FIG. 6, a band stop filter or notch filter having a transfer function like FIG. 7 can be embodied. A noise component like a reference spur of the phase locked loop can be effectively reduced using the band stop filter function. In case of embodying a filter using only passive elements, an inductor is necessarily used to embody a band stop loop filter and embodying the inductor may cause a problem of chip area. If using the supply regulated voltage controlled oscillator having an active loop filter function in accordance with some embodiments of the inventive concept, since an active loop filter can be easily embodied using only resistors and capacitors without degradation of performance, the supply regulated voltage controlled oscillator having an active loop filter function is well used in an application field that reducing a reference spur is important.

FIGS. 8 through 12 are drawings illustrating a phase locked loop 1000 using a supply regulated voltage controlled oscillator 100 having an active loop filter function in accordance with some embodiments of the inventive concept. Among blocks constituting the phase locked loop 1000, a phase-frequency detector 120, a frequency divider FD and a charge pump CP may be embodied by widely used general circuits.

Figure 7:
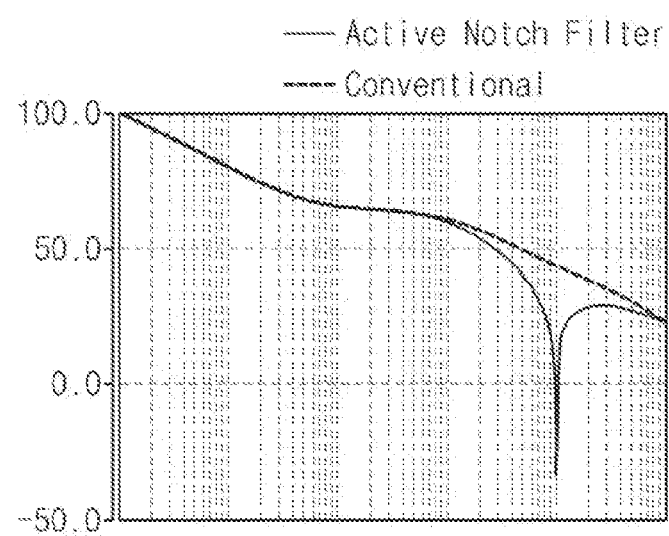
FIG. 7 is a transfer function of the band limiting filter of FIG. 6.
Figure 8:
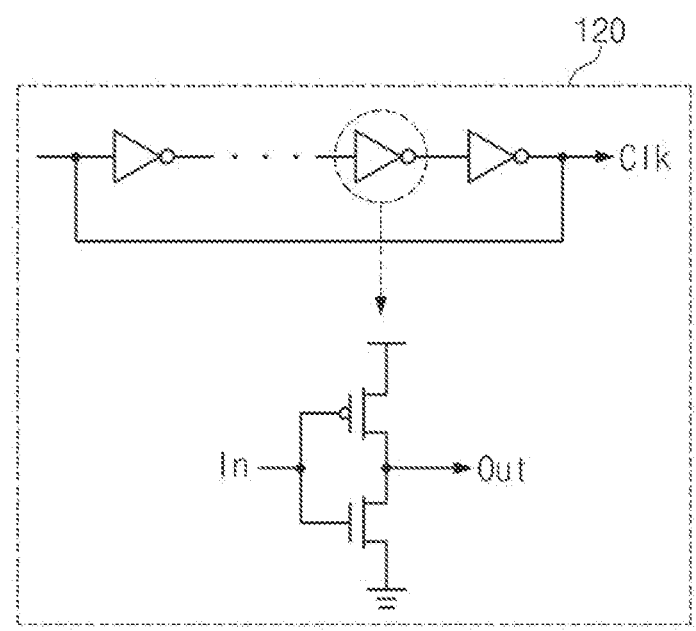
FIG. 8 is a drawing illustrating a supply controlled oscillator used in a supply regulated voltage controlled oscillator in accordance with some embodiments of the inventive concept.
Figure 9:
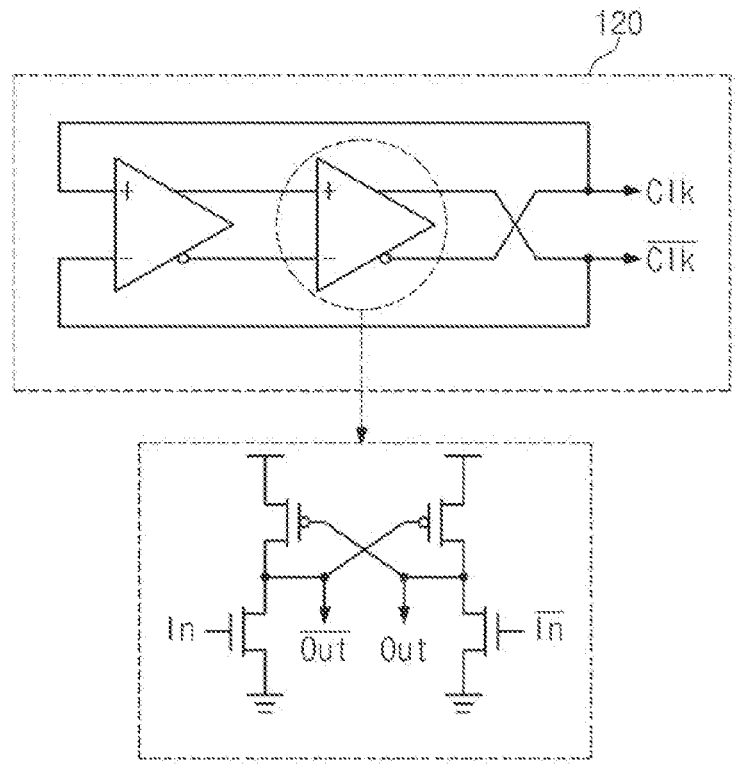
FIG. 9 is a drawing illustrating a supply controlled oscillator used in a supply regulated voltage controlled oscillator in accordance with some other embodiments of the inventive concept.

FIGS. 8 and 9 are drawings illustrating a supply controlled oscillator 20 used in a supply regulated voltage controlled oscillator (SRVCO) in accordance with some embodiments of the inventive concept and may used in the supply controlled oscillator 120 illustrated in FIG. 7. As described in FIG. 1, the supply regulated voltage controlled oscillator (SRVCO) includes a supply regulator and a supply controlled oscillator 120 embodied using an operational amplifier 140

The supply controlled oscillator 120 illustrated in FIG. 8 is formed by connecting an odd number of delay cells constituted by an inverter in a ring form and has an advantage that it is easily embodied and has the lowest power consumption with respect to an oscillation frequency.

The supply controlled oscillator 120 illustrated in FIG. 9 is formed by connecting an even number of pseudo-differential delay cells in a ring form and has an advantage that it has superior phase noise performance and can generate an even number of multi-phase clocks.

Figure 10:
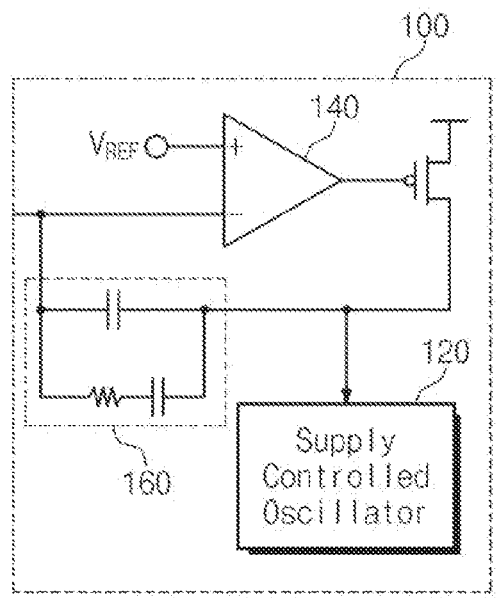
FIG. 10 is a drawing illustrating a supply regulated voltage controlled oscillator having an active loop filter and a two-stage amplifier using a PMOS in accordance with some embodiments of the inventive concept.
Figure 11:
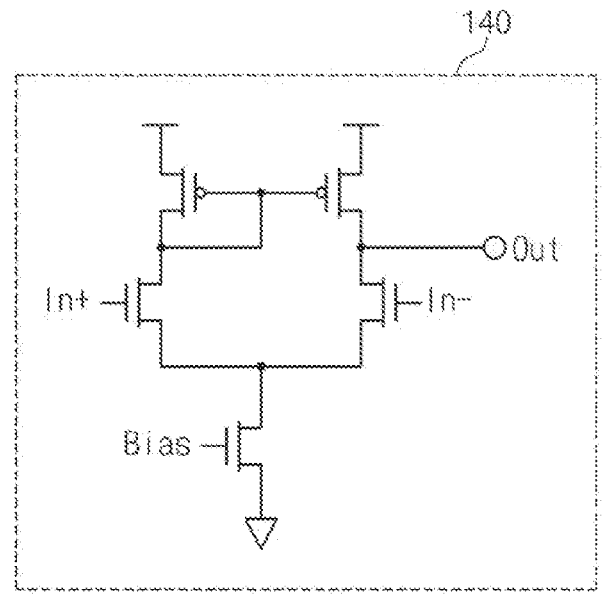
FIG. 11 is a drawing illustrating an operational amplifier used as a supply regulator in a supply regulated voltage controlled oscillator in accordance with some embodiments of the inventive concept.
Figure 12:
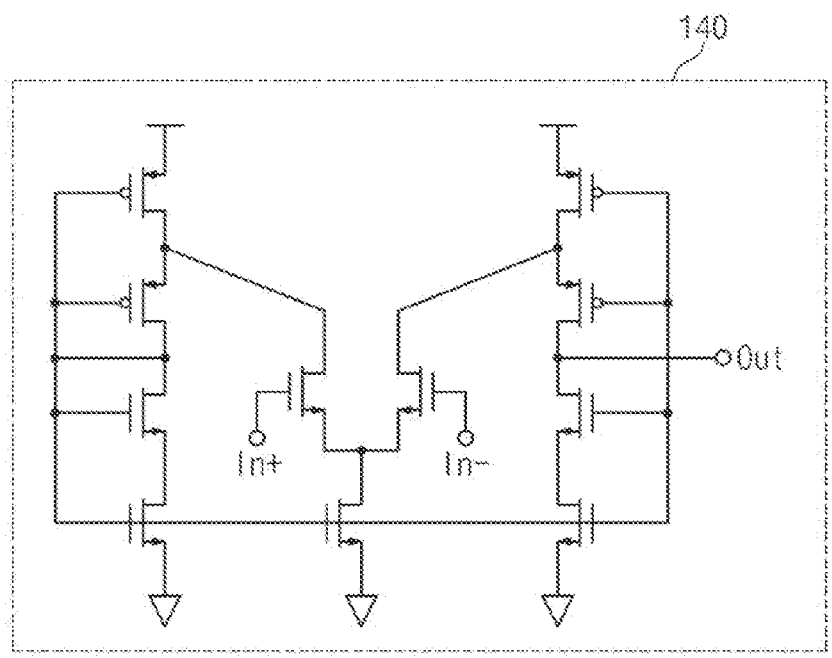
FIG. 12 is a drawing illustrating an operational amplifier used as a supply regulator in a supply regulated voltage controlled oscillator in accordance with some other embodiments of the inventive concept.

FIGS. 10 through 12 are drawings illustrating a supply regulated voltage controlled oscillator (SRVCO) and an operational amplifier 140 used as a supply regulator in accordance with some embodiments of the inventive concept. The operational amplifier 140 may adopt any circuit structure but it is desirable to adopt a structure of two stages or less to provide stability of a negative feedback.

If it is necessary to design an oscillator so that a frequency of the oscillator becomes maximum in a given supply voltage, a drop-out voltage of a supply regulator has to be minimized. In this case, as illustrated in FIG. 10, a drop-out voltage can be minimized by connecting a PMOS having a large W/L to an output terminal of the first-stage operational amplifier 140 to embody a two-stage amplifier.

If a supply voltage is sufficiently high, as illustrated in FIG. 11, the operational amplifier 140 can be designed using a differential amplifier. If a supply voltage becomes 0.5V or less, since MOSFETs constituting an amplifier circuit cannot operate in a saturation region, performance of the amplifier may be greatly degraded. In this case, a Baze amplifier illustrated in FIG. 12 may be used. This is because although MOSFETs constituting an amplifier circuit operate in a linear region, the Baze amplifier can provide a sufficiently high voltage gain and a wide bandwidth.

Figure 13A:
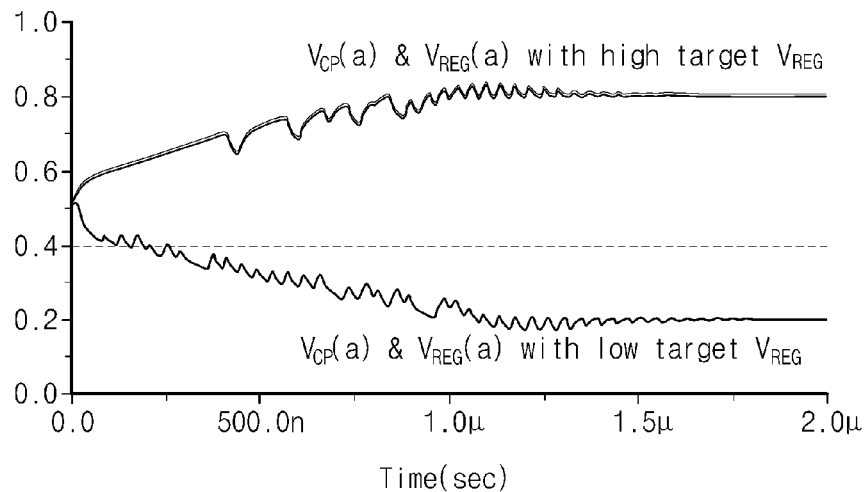
FIG. 13A is a graph comparing an output voltage of a charge pump with a power supply voltage of an oscillator in a phase locked loop using a conventional supply regulated voltage controlled oscillator.
Figure 13B:
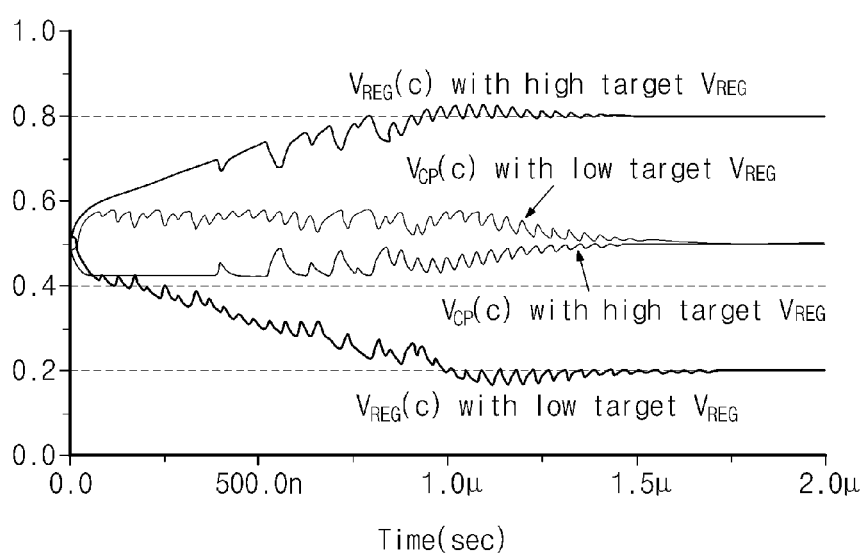
FIG. 13B is a graph comparing an output voltage of a charge pump with a power supply voltage of an oscillator in a phase locked loop using a supply regulated voltage controlled oscillator having an active loop filter function in accordance with some embodiments of the inventive concept.
Figure 14:
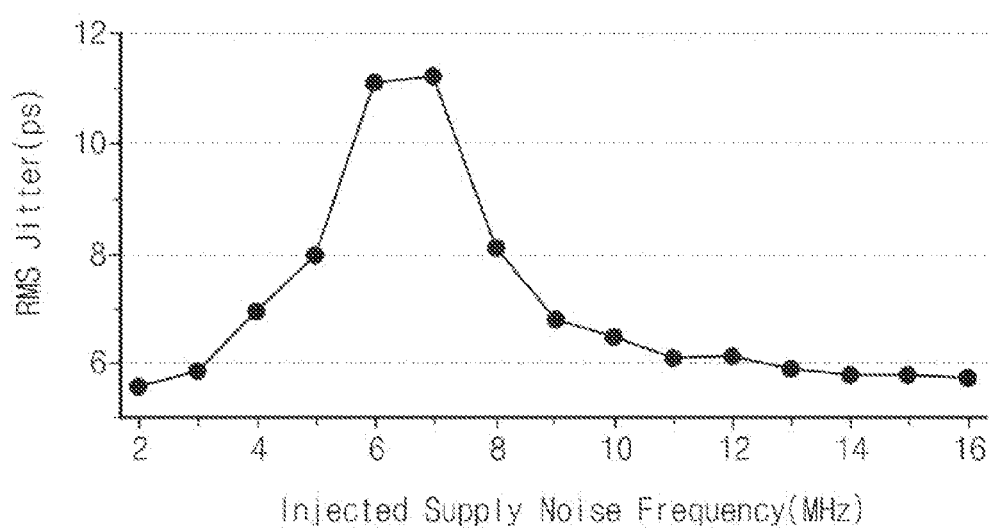
FIG. 14 is a drawing illustrating output jitter performance of a phase locked loop using a supply regulated voltage controlled oscillator having an active loop filter function in accordance with some embodiments of the inventive concept.

FIGS. 13A, 13B and 14 are drawings illustrating a supply regulated voltage controlled oscillator having a function of an active loop filter and a simulation result of a phase locked loop using the supply regulated voltage controlled oscillator in accordance with some embodiments of the inventive concept.

FIGS. 13A and 13B illustrate that an output voltage of a charge pump is separated from a control voltage of an oscillator, which is an advantage of an active loop filter. FIG. 13A illustrates an output voltage of a charge pump and a control voltage of an oscillator when using a conventional passive loop filter and a supply regulated voltage controlled oscillator. FIG. 13B illustrates an output voltage of a charge pump and a control voltage of an oscillator when using a supply regulated voltage controlled oscillator having a function of an active loop filter in accordance with some embodiments of the inventive concept. As illustrated in FIG. 13B, when using a supply regulated voltage controlled oscillator having a function of an active loop filter in accordance with some embodiments of the inventive concept, an output voltage $V_{cp}$ is separated from a control voltage $V_{REG}$ to converge to a specific voltage.

FIG. 14 illustrates performance of a phase locked loop using a supply regulated voltage controlled oscillator having a function of an active loop filter in accordance with some embodiments of the inventive concept. When adding a noise of 0.2V at a supply voltage of 1V, even if the supply voltage is changed by 20, output jitter performance of the phase locked loop is not greatly degraded.

The results illustrated in FIGS. 13A, 13B and 14 are advantages of a conventional active loop filter and a supply regulated voltage controlled oscillator. The supply regulated voltage controlled oscillator having a function of an active loop filter performs a supply regulation function and an active loop filter function using only one operational amplifier.

According to some embodiments of the inventive concept, since an operational amplifier is not additionally used, a supply regulated voltage controlled oscillator having an active loop filter can be provided while power, chip area and noise performance do not suffer a loss.

According to some embodiments of the inventive concept, since using an active loop filter included in a supply regulated voltage controlled oscillator, in a phase locked loop, an output voltage of a charge pump and a control voltage of an oscillator can be separated from each other and the output voltage of the charge pump can be fixed to a specific voltage, a design condition with respect to an output voltage range of the charge pump can be greatly eased or a supply voltage can be effectively lowered.

According to some embodiments of the inventive concept, various transfer functions can be embodied without using an inductor through a supply regulated voltage controlled oscillator having a function of an active loop filter.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A phase locked loop comprising:
a phase frequency detector comparing a reference frequency and a frequency of a signal corresponding to a clock signal to output a pulse signal in response to a difference between the reference frequency and the frequency of the signal;
a charge pump controlling charge amount on the basis of the pulse signal; and
a supply regulated voltage controlled oscillator outputting the clock signal in response to an input signal, the supply regulated voltage controlled oscillator comprising an operational amplifier used as a supply regulator, a negative feedback circuit connected to an output terminal of the operational amplifier and feeding an output signal of the operational amplifier back to an inverting input terminal of the operational amplifier, a notch filter connected between an output terminal of the charge pump and the inverting input terminal of the operational amplifier, and a supply controlled oscillator outputting the clock signal in response to the output signal of the operational amplifier,
wherein an output of the charge pump is input to the inverting input terminal of the operational amplifier,
wherein a reference voltage is input to a non-inverting input terminal of the operational amplifier, and
wherein a capacitor is connected between the notch filter and the output terminal of the amplifier.

2. The phase locked loop of claim 1, wherein the supply regulated voltage controlled oscillator further comprises a PMOS for minimizing a drop-out voltage of the supply regulator of the supply regulated voltage controlled oscillator so that an output frequency of the supply regulated voltage controlled oscillator is maximized.

3. The phase locked loop of claim 1, wherein in the case that a supply voltage of the supply regulated voltage controlled oscillator is 0.5V or less, the operational amplifier is a Baze amplifier.

4. The phase locked loop of claim 1, wherein the negative feedback circuit comprises a resistor and a capacitor connected to each other in parallel.

5. The phase locked loop of claim 4, wherein the negative feedback circuit comprises a notch filter.

6. A phase locked loop comprising:
a supply regulated voltage controlled oscillator outputting a clock signal in response to an input signal;
a frequency divider receiving a feedback signal from the supply regulated voltage controlled oscillator and dividing a frequency of the feedback signal;
a phase frequency detector comparing a reference frequency and a frequency of an output of the frequency divider to output a pulse signal in response to a difference between the reference frequency and the frequency of the output; and
a charge pump controlling charge amount on the basis of the pulse signal,
wherein the supply regulated voltage controlled oscillator comprises:
an operational amplifier having an inverting input terminal and a non-inverting input terminal;
a negative feedback circuit connected to an output terminal of the operational amplifier and feeding an output signal of the operational amplifier back to the inverting input terminal of the operational amplifier;
a notch filter connected between an output terminal of the charge pump and the inverting input terminal of the operational amplifier; and
a supply controlled oscillator outputting the clock signal in response to the output signal of the operational amplifier,
wherein an output of the charge pump is input to the inverting input terminal of the operational amplifier,
wherein a reference voltage is input to the non-inverting input terminal of the operational amplifier,
wherein the negative feedback circuit comprises a loop filter including passive elements to interact with the operational amplifier, and whereby having an active loop filter function, and
wherein a capacitor is connected between the output terminal of the operational amplifier and the notch filter.

7. The phase locked loop of claim 2, wherein a gate terminal of the PMOS is connected to the output terminal of the operational amplifier and a source terminal of the PMOS is connected to Vdd, and wherein the negative feedback circuit feeds an output signal of a drain terminal of the PMOS back to the inverting input terminal of the operational amplifier.

8. The phase locked loop of claim 1, wherein the notch filter includes two resistors and two capacitors in parallel with the two resistors, and wherein the capacitor is connected between the output terminal of the operational amplifier and a connection between the two resistors of the notch filter.

9. The phase locked loop of claim 6, wherein the notch filter includes two resistors and two capacitors in parallel with the two resistors, and wherein the capacitor is connected between the output terminal of the operational amplifier and a connection between the two resistors of the notch filter.

\* \* \* \* \*